United States Patent [19]

Inukai

[11] 4,051,388

[45] Sept. 27, 1977

[54] FLIP-FLOP ACCOMPANIED BY TWO CURRENT SWITCHES, ONE HAVING A SMALLER CURRENT SINK CAPABILITY THAN THE OTHER

[75] Inventor: Hidemori Inukai, Tokyo, Japan

[73] Assignee: Nippon Electric Company, Ltd., Japan

[21] Appl. No.: 681,601

[22] Filed: Apr. 29, 1976

[30] Foreign Application Priority Data

May 7, 1975 Japan ............................. 50-55723

[51] Int. Cl.² ................ H03K 3/286; H03K 3/353; H03K 19/34
[52] U.S. Cl. ............................ 307/279; 307/205; 307/238; 307/247 R; 307/270; 307/DIG. 5; 340/173 R
[58] Field of Search ............ 307/238, 251, 279, 289, 307/291, 247, DIG. 3, DIG. 4, DIG. 5; 340/173 R

[56] References Cited

U.S. PATENT DOCUMENTS

| 3,573,507 | 4/1971 | Eng | 307/279 |
|---|---|---|---|
| 3,851,189 | 11/1974 | Moyer | 307/279 |
| 3,858,061 | 12/1974 | Carpenter et al. | 307/279 |
| 3,902,082 | 8/1975 | Proebsting et al. | 307/279 |
| 3,906,464 | 9/1975 | Lattin | 307/DIG. 5 X |
| 3,938,109 | 2/1976 | Gionis et al. | 307/DIG. 5 X |
| 3,959,781 | 5/1976 | Mehta et al. | 307/DIG. 5 X |
| 3,987,315 | 10/1976 | Matsue | 307/279 |

*Primary Examiner*—John S. Heyman
*Assistant Examiner*—Larry N. Anagnos

[57] ABSTRACT

A first current switching circuit is connected to a first node of a flip-flop circuit and has an input terminal. A second current switching circuit is connected to a second node of the flip-flop and has a control terminal connected to the first node and an activation terminal. The second switching circuit has a smaller current sinking capability than the first. An activation signal for activating the flip-flop is also supplied to the activation terminal. The first switching circuit may comprise decoder transistors responsive to address signals to select memory cells connected to the first node through an address line driver.

8 Claims, 4 Drawing Figures

FLIP-FLOP ACCOMPANIED BY TWO CURRENT SWITCHES, ONE HAVING A SMALLER CURRENT SINK CAPABILITY THAN THE OTHER

BACKGROUND OF THE INVENTION

This invention relates to a flip-flop circuit arrangement which well adapted for use as a peripheral circuit, for example as a decoder circuit, particularly of the NOR type, an inverter for address inputs, and a sense amplifier, for a semiconductor memory.

A NOR decoder circuit has been employed as a circuit for decoding a group of address signals for a memory circuit comprising a large number of insulated-gate field-effect transistors. A conventional NOR decoder circuit comprises an output terminal connected to predetermined ones of the memory cells through an address line driver. The NOR decoder circuit further comprises a load field-effect transistor having a source electrode connected to the output terminal, a drain electrode supplied with d.c. power, and an insulated gate electrode supplied with a precharge signal. The NOR decoder circuit still further comprises a plurality of decoder field-effect transistors, equal in number to the input address signals to be decoded, having grounded source electrodes, drain electrodes connected to the output terminal, and insulated gate electrodes supplied with the respective true and/or complementary address signals. The precharge signal makes the decoder circuit produce a logic "1" level output signal at the circuit output terminal when no address signals are supplied to the decoder transistors. When at least one of the true and/or complementary address signals applied to the decoder transistors is at the logic "1" level, the decoder output signal is switched to a logic "0" level and thus put in a nonselecting state. Only when all of the true and/or complementary address signals applied to the decoder transistors are logic "0's", the decoder output signal remains at the logic "1" level and is thus in a selecting state.

For input address signal, N in number, use is made of $2^N$ similar decoder circuits. In response to a group of input address signals, only one of the decoder circuits derives the selecting decoder output signal while others produce nonselecting decoder output signals. The address line drivers are activated after all nonselecting decoder output signals are switched to the logic "0" level.

In addition to its simple structure, the NOR decoder circuit is advantageous by reason of its low power consumption. Power is needed only for switching the precharged logic "1" level to the nonselecting logic "0" level. No d.c. power is consumed. On the other hand, access time depends on the time required to switch the precharged logic "1" level to the nonselecting logic "0" level. It is therefore necessary in order to reduce access time to raise the current sinking capability of the decoder transistors and to hence increase the geometrical dimensions thereof. In an integrated circuit, this means that the decoder transistors occupy an objectionably wide area.

Therefore, it is required that the decoder circuit can operate at a high speed without occupying a wide area in the integrated circuit device. Moreover, a similar requirement is present in other circuits, such as a sense amplifier, an address inverter used in a memory circuit, and the like. It has been found that this requirement can be met by providing an additional high-speed flip-flop type circuit for the circuit to operate at high speed.

SUMMARY OF THE INVENTION

It is therefore an object of the invention to provide a flip-flop circuit arrangement operable at a high speed.

It is another object of the invention to provide a flip-flop circuit arrangement suitable to be employed with circuits required to operate at a high speed.

It is still another object of the invention to provide a flip-flop circuit which can be combined with a NOR decoder circuit and can contribute to accelerating the operating speed of the decoder circuit.

According to this invention, a flip-flop circuit arrangement comprises a flip-flop circuit and a first and a second current switching circuit. The flip-flop circuit comprises a first and a second node. The first switching circuit having an input terminal is connected to the first node, while the second switching circuit is connected to the second node and has a control terminal connected to the first node and an activation terminal. The second switching circuit has a smaller current sink capability than the first.

In general, the first node voltage is rendered higher than the second node voltage while the flip-flop circuit is in the quiescent state. When the input signal of a high or a low level is applied to the input terminal while the flip-flop circuit and the second current switching circuit are in the activated state, the first node voltage becomes the opposite level to the input signal at a high speed and the second node voltage becomes the same level as the input signal also at a high speed. The flip-flop circuit arrangement may further comprise additional first current switching circuits, each having a larger current sink capability than the second switching circuit. If the above-mentioned and additional first switching circuits comprise decoder transistors with the first node voltage used as a decoder output signal, the flip-flop circuit arrangement accelerates the operating speed of the decoder circuit. The active circuit elements used in the flip-flop circuit arrangement are preferably MOS field-effect transistors (hereinafter abbreviated as a MOST). In the following description the N-channel type MOST's are used, although use may be made of field-effect transistors of other types, such as P-channel MOST's.

DESCRIPTION OF THE PREFERRED EMBODIMENTS

Figure 1:
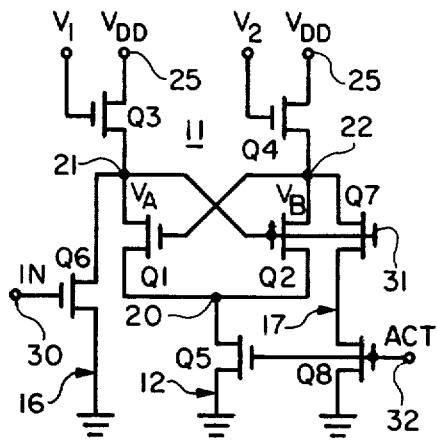
FIG. 1 is a circuit diagram of a flip-flop circuit arrangement according to a first embodiment of the instant invention.

Referring to FIG. 1, a flip-flop circuit arrangement according to a first embodiment of the present invention comprises a flip-flop circuit 11, activation means 12, a first current switching circuit 16, and a second current switching circuit 17. The flip-flop circuit 11 comprises a common point 20, a first node 21, a second node 22, and power terminals 25. The activation means 12 is connected between the common point 20 and a reference point, depicted by ground, of the flip-flop circuit arrangement. The first switching circuit 16 is connected between the first node 21 and the reference point and has an input terminal 30. The second switching circuit 17, having a smaller current sinking capability than the first switching circuit 16, is connected between the second node 22 and the reference point and has a control terminal 31 connected to the first node 21 and an activation terminal 32. The reference point is kept at a reference potential which is ground potential in the example being illustrated. The power terminals 25 are supplied with an electric power of voltage $V_{DD}$ with respect to ground. The input terminal 30 is supplied with an input signal IN that varies between a lower voltage nearly equal to the ground potential and a higher voltage. The activation means 12 and the activation terminal 32 are supplied with an activation signal ACT which resides in one of a first and a second predetermined state relative to ground at any time. The higher and lower voltages of the input signal IN may represent a logic "1" and a logic "0" level, respectively. The first and second states of the activation signal ACT may correspond to the logic "1" and "0" levels, respectively.

In the example being illustrated, the flip-flop circuit 11 comprises a first MOST Q1 having a source electrode connected to the common point 20, a drain electrode connected to the first node 21, and an insulated gate electrode connected to the second node 22, a second MOST Q2 having a source electrode connected to the common point 20, a drain electrode connected to the second node 22, and an insulated gate electrode connected to the first node 21, a third MOST Q3 having a source electrode connected to the first node 21, a drain electrode connected to the power terminal 25, and an insulated gate electrode, and a fourth MOST Q4 having a source electrode connected to the second node 22, a drain electrode connected to the power terminal 25, and an insulated gate electrode. The activation means 12 comprises a fifth MOST Q5 having a grounded source electrode, a drain electrode connected to the common point 20, and an insulated gate electrode supplied with the activation signal ACT. The first switching circuit 16 comprises a sixth MOST Q6 having a grounded source electrode, a drain electrode connected to the first node 21, and an insulated gate electrode connected to the input terminal 30. The second switching circuit 17 comprises a seventh MOST Q7 having a source electrode, a drain electrode connected to the second node 22, and an insulated gate electrode serving as the control terminal 31, and an eighth MOST Q8 having a grounded source electrode, a drain electrode connected to the source electrode of the seventh MOST Q7, and an insulated gate electrode connected to the activation terminal 32. The gate electrodes of the third and fourth MOST's Q3 and Q4 are supplied with control signals of different voltages $V_1$ and $V_2$, respectively.

When the activation signal ACT resides in the logic "1" and "0" levels while electric power is supplied to the power terminals 25, the flip-flop circuit 11 is placed in an activated and a quiescent state, respectively. In either event, the voltage $V_1$ at the gate of the MOST Q3 renders a first node voltage derived at the first node 21 higher by a voltage difference $\Delta V$ than a second node voltage developed at the second node 22 and yet provides the first and second node voltages with the logic "1" level. For this purpose, a threshold voltage $V_{TH}$ of the MOST Q3 is made equal to that of the MOST Q4 and the voltage $V_1$ at the gate of the MOST Q3 is made higher by $\Delta V$ than that $V_2$ at the gate of the MOST Q4 with both the values $V_1$ and $V_2$ being determined to be higher than $V_{TH}$. Otherwise, the threshold voltage of the MOST Q3 is made smaller by $\Delta V$ than that $V_{TH}$ of the MOST Q4 and both of the voltage $V_1$ and $V_2$ are made equal to each another and, for example, to the power supply voltage $V_{DD}$. In both cases, since a source voltage is equal to a gate voltage minus a threshold voltage, the precharged node voltages $V_A$ and $V_B$ become respectively $(V_2 + \Delta V - V_{TH})$ and $(V_2 - V_{TH})$ which are capable of making the MOST's Q1 and Q2 conductive. Moreover, when the activation signal ACT and an input signal IN are both in the "1" level, the current sink capability of MOST's Q7 and Q8 is made smaller than that of the MOST Q6. For this purpose, either of the respective areas occupied by MOST's Q7 and Q8 on the integrated circuit semiconductor chip is made smaller than that occupied by the MOST Q6.

Now assume that the flip-flop circuit 11 and the second switching circuit 17 are activated by the activation signal ACT and the input signal IN is in the "0" level. In this case, since the MOST Q6 is in the off-state and the voltage $V_A$ at the first node 21 is higher by $\Delta V$ than the voltage $V_B$ at the second node 22, the second node voltage $V_B$ is immediately switched from the logic "1" level to the logic "0" level by the positive feedback provided by the flip-flop circuit 11. Therefore, the MOST Q1 becomes nonconductive and hence the "1" level is maintained at the first node 21 and a "0" level is generated at the second node 22.

When the input signal assumes the "1" level while the flip-flop circuit 11 and the switching circuit 17 are activated, the first node voltage $V_A$ decreases more quickly than the second node voltage $V_B$ because the current sinking capability of the switching circuit 16 is larger than that of the switching circuit 17. As soon as the first node voltage $V_A$ decreases below the second node voltage $V_B$, the former is further reduced to the "0" level due to the positive feedback of the flip-flop circuit 11.

In this flip-flop circuit 11, the activation signal ACT and the signal supplying the voltage $V_1$ to the gate of the MOST Q3 may be timing signals of opposite polarities to each another. The voltage V2 at the gate of the MOST Q4 may be applied from a D.C. power source. In this case, when the MOST Q2 is in the on-state determined by the input signal IN, a direct current flows through MOST's Q2 and Q4. To eliminate the direct current flowing in the circuit, the signal supplying the voltage $V_2$ may be a timing signal of the same phase as that supplying the voltage $V_1$.

Figure 3:
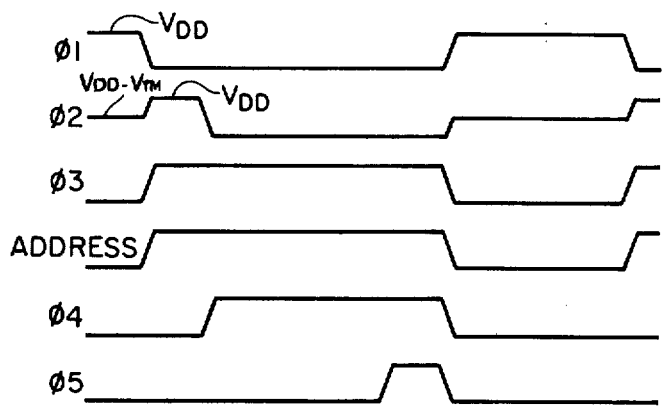
FIG. 3 illustrates wave forms of control signals used in the flip-flop circuit, in the decoder circuit and in the address line driver depicted in FIG. 2 according to the second embodiment.
Figure 2:
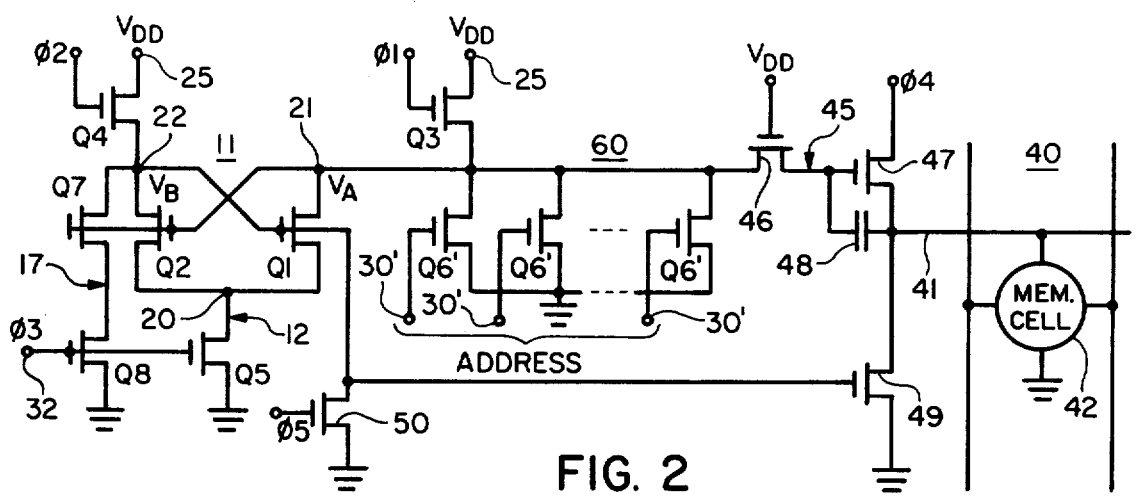
FIG. 2 shows a flip-flop circuit combined with a NOR decoder circuit according to a second embodiment of this invention together with an address line driver and a portion of a semiconductor memory.

Referring to FIGS. 2 and 3, a flip-flop circuit 11 used in combination with a NOR decoder circuit 60 according to a second embodiment of this invention is similar to that according to the first embodiment except for the first current switching circuit 16. In place of the first switching circuit 16 illustrated with reference to FIG. 1, a plurality of decoder transistors Q6' of the decoder circuit 60 are connected in parallel between the first node 21 and the ground. The insulated gate electrodes of these transistors Q6' are connected to respective input terminals 30' to which true and/or complementary address signals ADDRESS are applied. The third transistor Q3 connected between the first node 21 and the power source $V_{DD}$ is used as a load transistor of the decoder circuit 60. The second switching circuit 17 must have a smaller current sink capability than any of the decoder transistors Q6'. Thus, the size of the decoder transistors Q6' can be made as small as that of the conventional decoder transistors, by rendering the area of either or each of the transistors Q7 and Q8 smaller than the area of each decoder transistor Q6'. When all of the applied true and/or complementary address signals ADDRESS are of the logic "0" level, the NOR decoder circuit 60 produces a first node voltage of the logic "1" level as a decoder output representative of a common address of predetermined ones of the field-effect transistor memory cells of a semiconductor memory 40. A first timing signal $\phi$ of the above-considered voltage $V_1$ as a high level voltage is applied to the gate of the common load transistor Q3 for the flip-flop circuit 11 and the NOR decoder circuit 60, while a second timing signal $\phi_2$ of the already mentioned voltage $V_2$ is applied to the gate of the fourth MOST Q4. A third timing signal $\phi_3$ is used as the activation signal ACT.

The first node 21 is connected to an address bus line 41, such as a word selection line, known in the art for the predetermined memory cells (only one thereof 42 being illustrated) through an address line driver 45 described in the preamble of this specification. The address line driver 45 comprises a MOST 46 having a drain electrode connected to the first node 21, a source electrode, and an insulated gate electrode supplied with the electric power $V_{DD}$, a driver MOST 47 having an insulated gate electrode connected to the source electrode of the MOST 46, a source electrode connected to the address bus line 41, and a drain electrode supplied with a fourth timing signal $\phi_4$, a bootstrap capacitor 48 connected between the gate and source electrodes of the driver MOST 47, and a load MOST 49 having a grounded source electrode, a drain electrode connected to the source electrode of the driver MOST 47, and an insulated gate electrode connected to the second node 22. The NOR decoder circuit 60 further comprises a further MOST 50 having a grounded source electrode, a drain electrode connected to the second node 22, and an insulated gate electrode supplied with a fifth timing signal $\phi_5$. In this circuit the threshold voltages of MOST's Q3 and Q4 are equal to $V_{TH}$.

When the first timing signal $\phi_1$ of the logic "1" level of voltage $V_{DD}$ in this example is applied to the common load MOST Q3, the first node 21 is precharged to a first node voltage $V_A$ equal to the voltage $V_{DD}$ minus the threshold voltage $V_{TH}$. When the second timing signal $\phi_2$ of the logic "1" level having the voltage $(V_{DD} - V_{TH})$ in this example is applied to the MOST Q4, the second node 22 is precharged to a second node voltage $V_B$ equal to the voltage $(V_{DD} - V_{TH})$ minus the threshold voltage $V_{TH}$, and hence the voltage $V_B$ is lower by $V_{TH}(\Delta V)$ than the voltage $V_A$. When the timing signal $\phi_1$ turns to the "0" level near ground potential and the timing signal $\phi_3$ and at least one of the true and/or complementary address signals ADDRESS applied to the decoder 60 turns to the "1" level, the flip-flop circuit 11 and the second switching circuit 17 are activated and the MOST Q6' having a gate 30' applied with the "1" level signal is in the on-state.

As described above, since the area of either or each of MOST's Q7 and Q8 is smaller than that of the MOST Q6', that is, the area of the MOST Q6' is wider than that of MOST's Q7 and Q8, the voltage $V_A$ decreases more quickly than the voltage $V_B$. As soon as the voltage $V_A$ decreases below the second node voltage $V_B$, the former is immediately switched to the "0" level due to the amplifying function of the flip-flop circuit 11. At this instant, the timing signal $\phi_2$ is increased to the power source voltage $V_{DD}$ and hence the node voltage $V_B$ increases to the voltage $(V_{DD} - V_{TH})$. Accordingly, the MOST Q1 with the gate supplied with the voltage $V_B$ exhibits a smaller resistance, that is, the current sinking capability of the MOST Q3 becomes larger. Therefore, the amplifying function of the flip-flop circuit 11 is more quickly performed by employing the timing signal $\phi_2$ having the voltage $V_{DD}$ at the time the flip-flop circuit is activated. However, even if the timing signal $\phi_2$ is turned to the "0" level when the flip-flop circuit is activated, the flip-flop circuit 11 can quickly perform the amplifying function.

Thus, according to the present invention, the decoder transistors Q6' need not occupy a very wide area on an integrated circuit chip. Rather, they may occupy the same small area as conventionally provided that either or each of MOST's Q7 and Q8 has a narrower area. Moreover, the non-selecting "0" level output is derived at a far higher speed at the decoder output than the conventional decoder. Furthermore, since the timing signal $\phi_1$ is in the "0" level during activation of the flip-flop circuit, the common load transistor Q3 is in the off-state. Therefore, any direct current does not flow through the first node 21 from the power source $V_{DD}$. Moreover, MOST's Q2, Q7 are in the off-state and hence there is no current flowing through the node 22. Accordingly, there is no power consumption in $2^N - 1$ of the non-selecting decoders.

Since the logic "0" decoder output signal is thus supplied to the gate electrode of the driver MOST 47, the potential on the address bus line 41 is maintained at the "0" level when the fourth timing signal $\phi_4$ turns to the "1" level. The load MOST 49, which is made conductive by the "1" level voltage $V_B$ of the second node 22, clamps the address bus line 41 to the low level to prevent the potential on the address bus line 41 from being erroneously switched by noise to the logic "1" level. When the fifth timing signal $\phi_5$ is in the "1" level, the switching MOST 50 is switched from the off-state to the on-state and hence, the voltage $V_B$ at the second node 22 is in the "0" level and the flip-flop circuit 11 is reset.

If all true and/or complementary address signals ADDRESS are of the logic "0" level when the flip-flop circuit 11 and the second current switching circuit 17 are activated by the third timing signal $\phi_3$ of the "1" level, since the voltage $V_A$ at the first node 21 is larger than the voltage $V_B$ at the second node 22, the second node voltage $V_B$ is immediately switched to the logic "0" level with the first node voltage $V_A$ hardly reduced and maintained at the logic "1" level as has also been described. The driver MOST 47 therefore impresses a logic "1" level on the address bus line 41 when the fourth timing signal $\phi_4$ is turned to the logic "1" level. When the flip-flop circuit 11 is activated, the second timing signal $\phi_2$ supplied to the gate of MOST Q4 is increased to the power source voltage $V_{DD}$ as described above. However, since the voltage $V_A$ is higher than the voltage $V_B$ at the moment when the flip-flop circuit is activated, the voltage $V_B$ is securely turned to the "0" level by the positive feedback of the flip-flop circuit.

The second timing signal $\phi_2$ turns to the logic "0" level to cut off the d.c. current which would otherwise continuously flow through the fourth, second, and fifth MOST's Q4, Q2, and Q5 after selection of the one bit. Therefore, the d.c. current flows only in one selecting decoder among the $2^N$ decoders and only when the second timing signal $\phi_2$ is in the "0" level after activation of the flip-flop circuit. Therefore, the power consumed by the decoders is extremely small. As has been mentioned, the second timing signal may be turned to the "0" level simultaneously with the first timing signal $\phi_1$ when the flip-flop circuit is activated. In such case, no d.c. current flows and power consumption becomes nearly zero. The fifth timing signal $\phi_5$ subsequently turns to the logic "1" level to make the MOST 50 reduce the second node voltage $V_B$ in order to facilitate return of the second node voltage $V_B$ to the precharged state.

Figure 4:
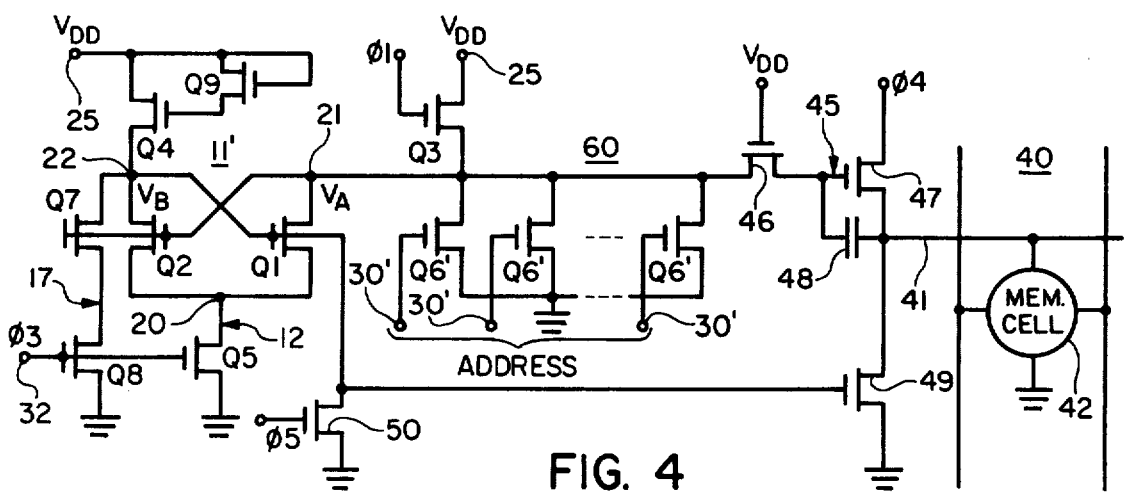
FIG. 4 shows a flip-flop circuit arrangement combined with a NOR decoder circuit according to a third embodiment of this invention together with an address line driver and a portion of a semiconductor memory.

Finally referring to FIG. 4, a flip-flop circuit 11' coupled with the NOR decoder 60 according to a third embodiment of this invention is similar to that 11 according to the second embodiment except for the circuit for providing the gate voltage to the fourth MOST Q4. Instead of the second timing signal $\phi_2$, a fixed voltage is supplied to the fourth MOST Q4 by a ninth MOST Q9 having a source electrode connected to the gate electrode of the fourth MOST Q4 and a drain and an insulated gate electrode connected to the power terminal 25. This fixed voltage amounts to the power voltage $V_{DD}$ minus threshold voltage of MOST Q9, and the precharge voltage supplied to the second node 22 is equal to $V_{DD}$ minus a sum of the threshold voltages of the fourth and ninth MOST's Q4 and Q9. Therefore, if MOST's Q4, Q9 and Q3 have the same structure with a common threshold voltage $V_{TH}$ and the "1" level voltage of $\phi_1$ is $V_{DD}$, the difference $\Delta V$ in the precharged voltages at the first and second nodes 21 and 22 becomes equal to $V_{TH}$.

In the above embodiments, the MOST's utilized are of enhancement type, in which a conductive path, viz., a channel, is not formed between a source and a drain under the zero gate-bias condition. Instead, depletion type MOST's may be used, in which a channel is present under the zero gate-bias condition. In this case, back-gate bias should be applied to a semiconductor substrate in which the circuit is integrated. The drain and the source electrodes of the MOST's employed may be replaced by the source and the drain electrodes thereof, respectively.

While in the second and third embodiments it has been described that the flip-flop circuit was combined with a NOR decoder of a memory circuit, the flip-flop circuit of the invention may be combined with a NOR-gate generally used not as a decoder but as a logic circuit or with a NOR decoder used in circuits other than a memory circuit. Moreover, the flip-flop circuit according to the invention may be used with an address-input inverter and an output sense amplifier and, furthermore, the flip-flop circuit of the invention may be combined with a circuit where clamping to a predetermined level is required at a high speed.

What is claimed is:

1. A circuit arrangement comprising: a flip-flop circuit including a first field-effect transistor having a first electrode connected to a common point, a second electrode connected to a first node, and a control electrode connected to a second node, a second field-effect transistor having a first electrode connected to said common point, a second electrode connected to said second node, and a control electrode connected to said first node, and a third field-effect transistor having a first electrode connected to a reference point, a second electrode connected to said common point, and a control electrode connected to a source of an activation signal; precharge means connected to said first and second nodes for rendering said first node voltage higher than said second node voltage when said flip-flop circuit is in quiescent state; a first current switching circuit including a fourth field-effect transistor having a first electrode connected to said reference point, a second electrode connected to said first node, and a control electrode connected to an input terminal; and a second current switching circuit including a fifth field effect transistor having a first electrode, a second electrode connected to said second node, and a control electrode connected to said first node, and a sixth field-effect transistor having a first electrode connected to said reference point, a second electrode connected to said first electrode of said fifth transistor, and control electrode connected to the source of said activation signal; said second switching circuit having a smaller current sink capability than said first switching circuit.

2. The circuit arrangement as claimed in claim 1, in which said transistors are formed on the same semiconductor chip and at least one of said fifth and sixth transistors occupies a smaller area on said semiconductor chip than said fourth transistor.

3. The circuit arrangement as claimed in claim 1 further comprising; additional current switching circuit including, in turn, additional field-effect transistors, respectively, each having a first electrode connected to said reference point, a second electrode connected to said first node, and a control electrode connected to an additional input terminal, each of said additional switching circuits having a larger current sink capability than said second switching circuit.

4. A circuit arrangement as claimed in claim 1, wherein said precharge means comprises a seventh field-effect transistor having a first electrode connected to said first node, a second electrode connected to a power source, and a control electrode, first means for supplying a first voltage to the control electrode of said seventh transistor, an eighth field-effect transistor having a first electrode connected to said second node, a second electrode connected to said power source, and a control electrode, and second means for supplying a second voltage to the control electrode of said eighth transistor.

5. The circuit arrangement as claimed in claim 4, wherein said first and second voltages have values capable of making said seventh and eighth transistors conductive, respectively, and the absolute value of said first voltage is higher than that of said second voltage.

6. A circuit arrangement as claimed in claim 4, wherein said second means comprises a ninth field effect transistor having a first electrode connected to the control electrode of said eighth transistor, a second electrode and a control electrode connected in common to said power source.

7. In combination, a flip-flop circuit residing in one of a quiescent state in which direct current conduction is eliminated in said flip-flop circuit and an activated state, said flip-flop including first and second nodes, first and second field-effect transistors cross-coupled to each other at said first and second nodes; a first current switching circuit connected to said first node and having an input terminal for receiving an input signal; a second current switching circuit connected to said second node and having a control terminal connected to said first node and further having an activation terminal for receiving an activation signal, said second switching circuit having a smaller current sinking capability than said first switching circuit; means for switching said flip-flop circuit from said quiescent state to said activated state in response to said activation signal; means for precharging said first and second nodes to first and second potentials sufficient in amplitude to cause said first and second transistors to be in their conductive state, respectively, during said quiescent state, said first potential being higher than said second potential; whereby said first node voltage becomes opposite in its digital level to said input signal and said second node voltage becomes of substantially the same digital level as said input signal when said flip-flop circuit is switched to said activated state by said switching means.

8. A decoder circuit comprising an output node; input terminals receiving a plurality of input signals; a plurality of field-effect transistors connected in parallel between said output node and a reference potential, control gates of said transistors being coupled with said input terminals; a flip-flop circuit having a quiescent state in which direct current paths are eliminated in said flip-flop circuit and an activated state and further having a first node directly connected to said output node and a second node; a current switching circuit connected to said second node, said current switching circuit having a control terminal connected to said first node and an activation terminal for receiving an activation signal, said switching circuit having a smaller current sinking capability than said transistors; means for switching said flip-flop circuit from said quiescent state to activated state in response to said activation signal; means for precharging said first and second potentials, respectively, during said quiescent state of said flip-flop circuit, said first potential being higher than said second potential; whereby said output node directly connected to said first node becomes said reference potential when at least one of said transistors becomes the conductive state at the same time that said flip-flop circuit is switched to said activated state by said switching means.

* * * * *